(12) United States Patent
Freris et al.

(10) Patent No.: US 10,728,298 B2
(45) Date of Patent: Jul. 28, 2020

(54) METHOD FOR COMPRESSED SENSING OF STREAMING DATA AND APPARATUS FOR PERFORMING THE SAME

(71) Applicant: QUALCOMM Incorporated, San Diego, CA (US)

(72) Inventors: Nikolaos Freris, Lausanne (CH); Orhan Ocal, St-Sulpice (CH); Martin Vetterli, Grandvaux (CH)

(73) Assignee: QUALCOMM Incorporated, San Diego, CA (US)

( * ) Notice: Subject to any disclaimer, the term of this patent is extended or adjusted under 35 U.S.C. 154(b) by 350 days.

(21) Appl. No.: 14/481,581

(22) Filed: Sep. 9, 2014

(65) Prior Publication Data

US 2015/0074238 A1 Mar. 12, 2015

Related U.S. Application Data

(60) Provisional application No. 61/877,162, filed on Sep. 12, 2013.

(51) Int. Cl.

| G06F 17/00 | (2019.01) |
| G06F 17/10 | (2006.01) |
| G06F 17/14 | (2006.01) |
| G06K 9/62  | (2006.01) |
| H04L 29/06 | (2006.01) |
| H04L 12/26 | (2006.01) |
| H03M 7/30  | (2006.01) |

(52) U.S. Cl.
CPC .......... *H04L 65/60* (2013.01); *H03M 7/3062* (2013.01); *H03M 7/3064* (2013.01); *H04L 43/0876* (2013.01)

(58) Field of Classification Search
CPC .......................... G06F 17/20539; G01S 7/021
See application file for complete search history.

(56) References Cited

U.S. PATENT DOCUMENTS

| 6,243,467 B1 * | 6/2001 | Reiter .................... G06F 7/725 380/30 |
| 6,243,497 B1 | 6/2001 | Chiang et al. |
| 2008/0275580 A1 * | 11/2008 | Andersen ............. G10L 19/005 700/94 |

(Continued)

FOREIGN PATENT DOCUMENTS

| CN | 101120399 A | 2/2008 |
| CN | 102172026 A | 8/2011 |

(Continued)

OTHER PUBLICATIONS

Freris N.M., et al., "Compressed Sensing of Streaming Data," Proceedings of the 51st Annual Allerton Conference on Communication, Control and Computing, Oct. 2013, pp. 1242-1249.

(Continued)

*Primary Examiner* — Nicholas R Taylor
*Assistant Examiner* — Ho T Shiu
(74) *Attorney, Agent, or Firm* — Shumaker & Sieffert, P.A.

(57) ABSTRACT

A computer-implemented method for sensing streaming data comprises recursively sampling an input stream of data using overlapping windowing to obtain at least one previous measurement regarding the input data stream, and employing the at least one previous measurement for obtaining a subsequent measurement.

18 Claims, 5 Drawing Sheets

(56) References Cited

U.S. PATENT DOCUMENTS

| | | | |
|---|---|---|---|
| 2009/0077148 A1* | 3/2009 | Yu | G06F 17/30539 |
| | | | 708/300 |
| 2010/0002777 A1* | 1/2010 | Boyle | G01S 7/021 |
| | | | 375/242 |
| 2010/0246920 A1* | 9/2010 | Vaswani | G06K 9/00523 |
| | | | 382/131 |
| 2011/0182352 A1* | 7/2011 | Pace | G06T 7/2006 |
| | | | 375/240.1 |
| 2011/0282181 A1 | 11/2011 | Wang et al. | |
| 2011/0286507 A1 | 11/2011 | Yu et al. | |
| 2012/0127029 A1* | 5/2012 | Rachlin | G01S 19/40 |
| | | | 342/357.23 |
| 2012/0148129 A1 | 6/2012 | Chang et al. | |
| 2012/0209600 A1* | 8/2012 | Kim | G10L 19/025 |
| | | | 704/219 |

FOREIGN PATENT DOCUMENTS

| | | |
|---|---|---|
| CN | 102722896 A | 10/2012 |
| CN | 103250352 A | 8/2013 |
| JP | 2011097570 A | 5/2011 |
| JP | 2011137817 A | 7/2011 |
| WO | WO-2009156896 A1 | 12/2009 |
| WO | WO-2012094804 A1 | 7/2012 |

OTHER PUBLICATIONS

Freris N.M., et al., "Recursive Compressed Sensing," IEEE Transactions on Information Theory, Dec. 2013, pp. 1-14.

International Search Report and Written Opinion—PCT/US2014/054993—ISA/EPO—dated Mar. 4, 2015.

Tan L.T., et al., "A Novel and Efficient Mixed-Signal Compressed Sensing for Wide-Band Cognitive Radio," Internet Article, Aug. 14, 2013 (Aug. 14, 2013), XP002735820, [Retrieved from the Internet; URL: http://www.slideshare.net/tanlethanh98/05668104 on Feb. 11, 2015]; 6 pages.

Li J., et al., "Collaborative Construction of Measurement Matrix and Reconstruction Algorithm in Compressive Sensing", Acta Electronica Sinica, vol. 41, Issue 1, Jan. 15, 2013, pp. 29-34.

\* cited by examiner

METHOD FOR COMPRESSED SENSING OF STREAMING DATA AND APPARATUS FOR PERFORMING THE SAME

RELATED APPLICATIONS

The present Application claims priority to U.S. Provisional Application No. 61/877,162 filed Sep. 12, 2013, which is hereby expressly incorporated by reference in its entirety.

FIELD OF INVENTION

The present invention is directed to a method for compressed sensing of streaming data and to the means for performing the same. More specifically, some embodiments include a method of compressed sensing of streaming data that employs a recursive algorithm for performing compressed sensing on streaming data, and an apparatus or system or computer program product capable of performing the method for compressed sensing of streaming data.

BACKGROUND OF INVENTION

In the field of signal processing, the signals of interest can be represented sparsely by using few coefficients in an appropriately selected orthonormal basis. Exemplarily, the Fourier basis is used for band limited signals or wavelet bases for piecewise continuous signals, such as images. While a small number of coefficients in the respective bases are enough to represent such signals, the Nyquist/Shannon sampling theorem suggests a sampling rate that is at least twice the signal bandwidth. Such a sampling rate is known in the art as the Nyquist rate. In many cases, the indicated sampling rate is much higher than the sufficient number of coefficients.

Recently, the Compressed Sensing (CS) framework was introduced aiming at sampling the signals not according to their bandwidth, but rather in accordance with their information content, that is, the number of degrees of freedom of the signal. This paradigm for sampling suggests a lower sampling rate compared to the classical sampling theory for signals that have sparse representation in some given basis. Typical signals that arise naturally in astronomy and biomedical imaging fit this model.

SUMMARY OF THE INVENTION

The present invention proposes in accordance with one of its embodiments a computer-implemented method for sensing streaming data, comprising recursively sampling an input stream of data using overlapping windowing to obtain at least one previous measurement regarding said input data stream, and employing said at least one previous measurement for obtaining a subsequent measurement.

In accordance with another embodiment of the present invention is proposed a system for sensing streaming data, including a plurality of modules, each module comprising a computer readable medium having thereon computer executable instructions for recursively sampling an input stream of data using overlapping windowing to obtain at least one previous measurement regarding said input data stream, and employing said at least one previous measurement for obtaining a subsequent measurement.

In accordance with yet another embodiment of the present invention is proposed a computer readable storage medium having recorded thereon a computer program for sensing streaming data, the computer program comprising an algorithm capable of recursively sampling an input stream of data using overlapping windowing to obtain at least one previous measurement regarding said input data stream, and employing said at least one previous measurement for obtaining a subsequent measurement.

In accordance with a further embodiment of the present invention, it is proposed an apparatus for performing compressed sensing of streaming data, comprising a recursive sampler arranged for recursively sampling an input stream of data using overlapping windowing to obtain at least one previous measurement regarding said input data stream, and a unit employing the at least one previous measurement for obtaining a subsequent measurement.

In accordance with one embodiment of the present invention, sensing of streaming data is a compressed sensing of streaming data, and the method for sensing streaming data employs a recursive scheme for performing sampling. The step of employing at least one previous measurement for obtaining a subsequent measurement comprises processing an input stream of data sampled during the step of recursive sampling via recursive estimation.

In accordance with another embodiment of the present invention, the method and means proposed by the invention involve inputting information regarding the data stream regarding a previous estimate obtained during a previous estimate obtention step, the previous estimate obtention step being prior to the recursive sampling step. The method further comprises performing count estimation based on information obtained during a data stream support detection step and calculating a least squares estimation (LSE) value for a data stream support set based on data obtained during said recursive estimation step. Further, the method comprises in accordance with another embodiment of the invention an averaging step, wherein the calculated least squares estimation value, the count estimation value, and the previous estimate to calculate an averaged value are averaged to obtain an averaged value. The averaged value is employed to obtain a new estimate for the streaming data.

In accordance with yet another embodiment of the present invention, the method proposed by the present invention further comprises the step of analyzing a computational complexity of the compressed sensing of streaming data and estimating an error degree of the method for sensing streaming data. The method further comprises obtaining convergence in an iterative optimization algorithm to decode a new window, the obtaining step comprising leveraging an overlapping window structure employed by the step of overlapping windowing and a signal estimate regarding the previous window. The method further yet comprises averaging signal estimates obtained from a plurality of windows, performing support set detection, and signal amplitude estimation. A voting scheme for robust support estimation in the presence of a high measurement noise may be as well applied in accordance with the present invention.

BRIEF DESCRIPTION OF DRAWINGS

Further objects and advantages of the invention will be appreciated from the following description, taken in conjunction with the included drawings, of which.

DETAILED DESCRIPTION OF THE INVENTION

Figure 1:
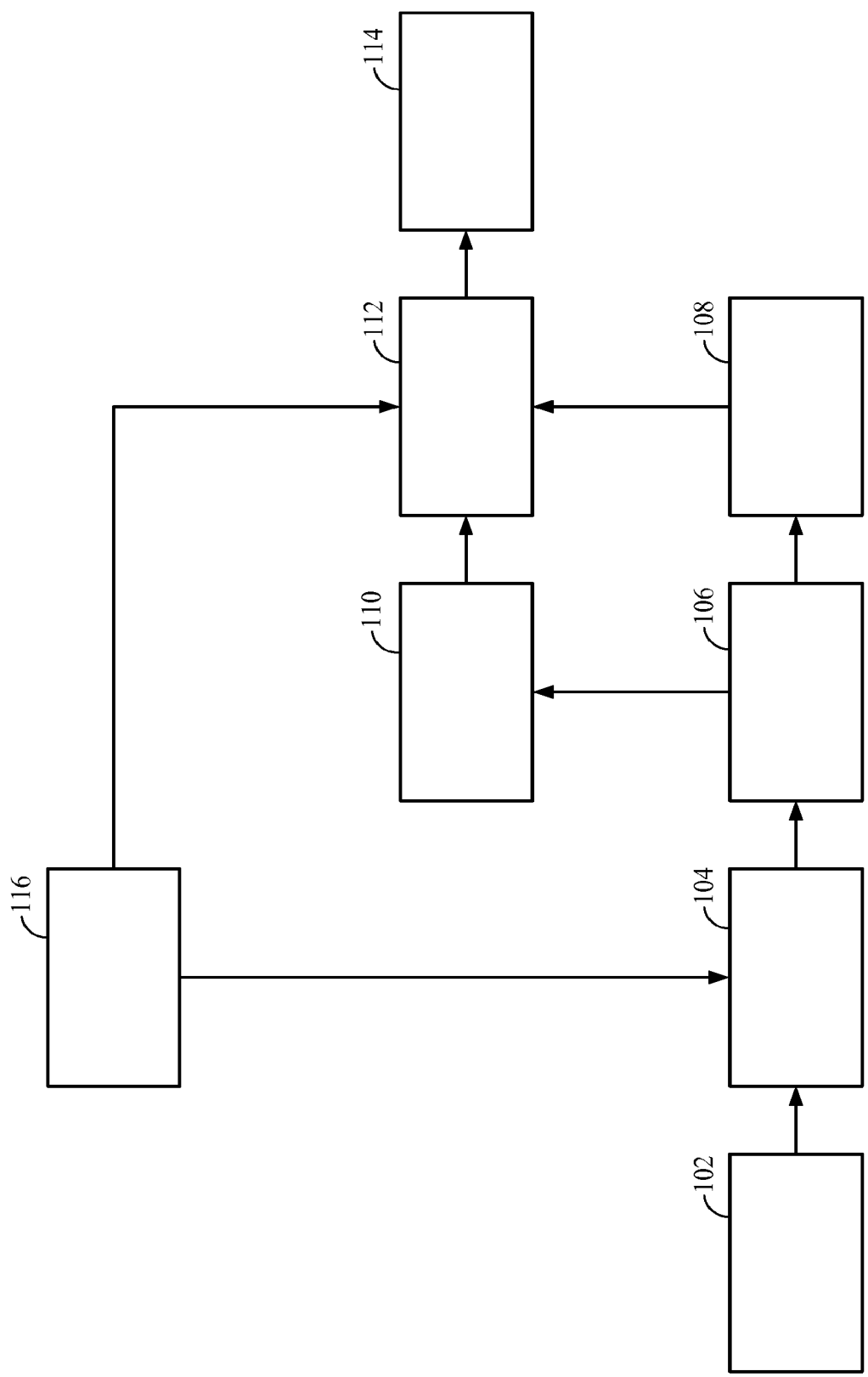
FIG. 1 is a block diagram of the method for sensing streaming data in accordance with one embodiment of the present invention.

The following description of the presently contemplated best mode of practicing the invention is not to be taken in a limiting sense, but is made merely for the purpose of describing the general principles of the invention. The scope of the invention should be determined with reference to the claims.

Although much progress has been made in the field of Compressed Sensing, a recursive algorithm for performing compressed sensing on streaming data still remains unaddressed. The computational complexity and the stability of signal estimation from noisy samples by applying compressed sensing on an input stream through successive windowing has not yet been addressed in the art.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium/media (i.e., data storage medium/media) having computer readable program code recorded thereon.

Any combination of one or more computer readable medium/media may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium, i.e., data storage medium, may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the likes and conventional procedural programming languages, such as the "C" programming language or similar programming languages. The program code may be executed entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, which executed via the processor of the computer or other programmable data processing apparatus, creates means for implementing the functions/acts specified in the flowchart and/or block diagram block or blocks.

These computer program instructions may also be stored in a computer readable medium that can direct a computer, other programmable data processing apparatus, or other devices to function in a particular manner. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Throughout the following description, capital boldface letters denote matrices (e.g., A) and boldface lowercase letters denote vectors (e.g., x).

In the following $x_i$ is used to denote the $i^{th}$ entry of vector x, and $a_i$ is used to denote the $i^{th}$ column of matrix A.

The $i^{th}$ sample vector, such as the $i^{th}$ window of the input stream, or the $i^{th}$ sampling matrix is denoted by superscript (e.g., $\mathbf{x}^{(i)}$ or $\mathbf{A}^{(i)}$).

The inner product between two vectors a and b is denoted as $\langle \mathbf{a},\mathbf{b}\rangle := \mathbf{a}^T\mathbf{b}$.

$|S|$ is indicative for the cardinality of a set S.

$E_x[\cdot]$ is indicative of the conditional expectation $E_x[\cdot] = E[\cdot|x]$ In the field of compressed sensing, frequently used terms to characterize either vectors or matrices are "k-sparsity", "mutual coherence", "restricted isometry property" and "generic k-sparse model". In the following said terms are elaborated upon briefly to illustrate their intended meaning through this document.

For a vector $x \in R^n$ its support is defined as supp(x):={i: $x_i \neq 0$}.

For the same vector $x \in R^n$ its pseudonorm $l_0$ is defined as $\|x\|_0 := |\text{supp}(x)|$, wherein $x_0$ is the cardinality of the support.

A vector x is sparse if and only if $$\|x\|_0 \leq k.$$

Typically k<<n, n being the number of columns of matrix A.

Exemplarily if x=[0 0 0 3 0-1 0 0 5 0], $x \in R^{10}$, $\|x\|_0=3$, and x is 3 sparse.

For a matrix $A \in R^{m \times n}$ the mutual coherence is defined as the largest normalized inner product between any two different columns of the matrix A, as follows:

$$\mu(A) := \max_{1 \leq i,j \leq n, i \neq j} \frac{|\langle a_i, a_j \rangle|}{\|a_i\|_2 \cdot \|a_j\|_2}.$$

For a matrix $A \in R^{m \times n}$, and given 0<k<n, the matrix A is said to satisfy the restricted isometry property (RIP) if there exists $\delta_k \in [0,1]$ such that:

$$(1-\delta_k)\|x\|_2^2 \leq \|Ax\|_2^2 \leq (1+\delta_k)\|x\|_2^2.$$

This condition should be valid for all $x \in R^n$ k-sparse vectors, where $\delta_k$ needs to be sufficiently small.

Random matrices, such as Gaussian, Bernoulli, randomly selected rows from DFT matrices are known to have been used as matrices for compressed sensing in the literature, since they satisfy the restricted isometry property with high probability. Examples of matrices satisfying the restricted isometry property are:
 a) n random vectors sampled from the m-dimensional unit sphere,
 b) random partial Fourier matrices obtained by selecting m rows from the n dimensional Fourier matrix uniformly at random,
 c) random Gaussian matrices having $A_{i,j} \sim N(0,1/m)$,
 d) random Bernoulli matrices where $$A_{i,j} \in \left\{ \frac{1}{\sqrt{m}}, \frac{-1}{\sqrt{m}} \right\}$$

with equal probability.

For the last two cases, matrix A satisfies a prescribed $\delta_k$ for any $$k \leq c_1 m / \log\left(\frac{n}{k}\right)$$

with a probability larger or equal than $1-2e^{-c_2 m}$, where $c_1$ and $c_2$ are constants that only depend on $\delta_k$.

Further terms employed thought this document are defined in the following:

"Recursively" is employed to indicate that the procedure is performed by repeating items in a self-similar way. In mathematics and computer science, the term refers to a method of defining functions in which the function being defined is applied within its own definition. Specifically, this defines an infinite number of instances (function values), using a finite expression that for some instances may refer to other instances, but in such a way that no loop or infinite chain of references can occur. The term is also used more generally to describe a process of repeating objects in a self-similar way. Recursion is the process a procedure goes through when one of the steps of the procedure involves invoking the procedure itself. A procedure that goes through recursion is said to be "recursive".

In signal processing, a window function (also known as an apodization function or tapering function) is a mathematical function that is zero-valued outside of some chosen interval. For instance, a function that is constant inside the interval and zero elsewhere is called a rectangular window, which describes the shape of its graphical representation. When another function or waveform/data-sequence is multiplied by a window function, the product is also zero-valued outside the interval: all that is left is the part where they overlap, the "view through the window". Applications of window functions include spectral analysis, filter design, and beamforming. In typical applications, the window functions used are non-negative smooth "bell-shaped" curves, though rectangle, triangle, and other functions can be used. A more general definition of window functions does not require them to be identically zero outside an interval, as long as the product of the window multiplied by its argument is square integrable, and, more specifically, that the function goes sufficiently rapidly toward zero. When the length of a data set to be transformed is larger than necessary to provide the desired frequency resolution, a common practice is to subdivide it into smaller sets and window them individually. To mitigate the "loss" at the edges of the window, the individual sets may overlap in time.

If x is a linear vector $x \in R^n$ and $y \in R^m$ is the vector of obtained samples $$y = Ax \qquad (1)$$

with $A \in R^{m \times n}$ being the sampling (sensing) matrix, the present invention proposes a method and means to recover x when m<<n. The system denoted with equation (1) is an underdetermined linear system. In accordance with compressed sensing, the main result is that if x is k-sparse and $k < c_m / \log(n/k)$, a solution to this undetermined linear system is possible.

Problem $P_0$ stated bellow should be solved in order to find the sparsest vector x that leads to the measurement y. This problem is, Non-deterministic Polynomial-time hard or NP-hard, requiring search over all subsets of columns of A. As it is known from the art, a problem H is NP-hard if and only if there is an NP-complete problem L that is polynomial time Turing-reducible to H (i.e., $L \leq_T H$). In other words, L can be solved in polynomial time by an oracle machine with an oracle for H.

Problem $P_0$ is stated as minimize $\|x\|_0$ subject to Ax=y

Since problem $P_0$ is in general NP-hard, this problem has to be 'approximated' by tractable methods. Two convex optimization problems are used for recovering sparse vectors from linear measurements.

A first optimization problem is referred to as "Basis Pursuit" wherein solving problem $P_0$ is equivalent to solving the $l_1$ minimization problem BP:

minimize $\|x\|_1$ subject to Ax=y for all k-sparse vectors x, if A satisfies the restricted isometry property (RIP) with $\delta_{2k} \leq \sqrt{2}-1$, the aforementioned problem is equivalent to $P_0$. The optimization problem (BP) is called Basis Pursuit. Since (BP) can be recast as a linear program, solving (BP) is more computationally efficient, e.g., via interior point methods, as opposed to solving problem ($P_0$) which is generally intractable for large instances.

A second optimization problem is referred to as the Least Absolute Selection and Shrinkage Operator (LASSO). In the presence of noise, the measurement model y=Ax becomes:

$$y=Ax+w; \quad (2)$$

where $w \in R^m$ represents additive measurement noise.

In this setting, a variant of Basis Pursuit may be applied, namely the Basis Pursuit Denoising (BPDN), best known as LASSO in the statistics literature, as:

$$\text{minimize } \|x\|_1 \text{ subject to } \|Ax-y\|_2 \leq \hat{\sigma} \quad (3)$$

where $\hat{\sigma} \in R^+$ is chosen appropriately to account for the additive noise in the measurements.

As known in the art, by duality, the problem can be posed equivalently as an unconstrained optimization problem:

$$\text{minimize } \|Ax-y\|_2^2 + \lambda \|x\|_1 \quad (4)$$

where $\lambda$ is the regularization parameter that controls the trade-off between sparsity and reconstruction error.

A theorem useful in developing the recursive scheme for performing compressed sensing on streaming data is the theorem regarding error of LASSO that states that if A satisfies the restricted isometry property (RIP) with $\epsilon_{2k} \leq \sqrt{2}-1$ the solution $x_*$ to equation (3) abides by the formula of:

$$\|x_*-x\|_2 \leq C_0 \cdot \|x-x_k\|_1/\sqrt{k} + C_1 \cdot \hat{\sigma} \quad (5)$$

wherein $C_0 \cdot \|x-x_k\|_1/\sqrt{k}$ is indicative of model mismatch and $C_1 \cdot \hat{\sigma}$ is indicative of noise. $C_0$ and $C_1$ are constants, where $x_k$ is the vector x with all but the largest k components set to 0. In other words, $x_k$ is the vector obtained by preserving k-many elements of x having highest magnitude.

In particular, if x is k-sparse and $\delta_{2k} \leq \sqrt{2}-1$ then $\|x_*-x\|_2 \leq C_1 \cdot \hat{\sigma}$.

The theorem states that the reconstruction error is upper bounded by the sum of two terms: the first is the error due to model mismatch, and the second is proportional to the measurement noise variance.

The key is that the assumption on the isometry constant is satisfied with high probability by matrices obtained from random vectors sampled from unit sphere, random Gaussian matrices and random Bernoulli matrices if $$m \geq C_k \log(n/k)$$

where C is a constant depending on each instance.

In the art it was showed that the error of LASSO can be used for near ideal support detection. To state the result characteristic for the near ideal support detection, a generic k-sparse model is defined.

If $x \in R^n$ denotes a k-sparse signal and $I_x:=\text{supp}(x)$ is its support set, the signal x is said to be generated by a generic k-sparse model if:
1) Support $I_x \subset \{1,2,\ldots,n\}$ of x is selected uniformly at random, and $|I_x|=k$, and
2) Conditioned on Ix, signs of non zeros are equally likely to be $-1$ and $1$.

The support set of the k-sparse signal may be detected as follows:

Assuming that $$\mu(A) \leq c_1/\log n$$

for a constant c1>0, x is generated from a generic k-sparse model and $$k \leq c_2 n / (\|A\|_2^2 \log n)$$

for a constant c2.

If, for $I_x:=\text{supp}(x)$, $$\min_{i \in I_x} |x_i| > 8\sigma \sqrt{2\log n}$$

the LASSO estimate obtained by choosing $\lambda = 4\sigma\sqrt{2\log n}$ for measurements where $$w \sim N(0, \sigma^2 I)$$

obeys:

$$\text{supp}(\hat{x}) = \text{supp}(x)$$

$$\text{sgn}(\hat{x}_i) = \text{sgn}(x_i) \text{ for } i \in I_x$$

with probability at least $$1 - \frac{2}{n}\left(\frac{1}{\sqrt{2\pi \log n}} + \frac{|I_x|}{n}\right) - O\left(\frac{1}{n^{2\log 2}}\right).$$

For the sampling matrix having elements $$A_{i,j} \sim N(0, 1/m)$$

the operator norm is $\|A\|_2 \sim \sqrt{n/m}$, thus the sparsity condition in the theorem becomes $$k \leq c_1 m / \log n.$$

In order for this inequality to be satisfied, the value for m needs to be $m = c'_1 k \log n$.

Furthermore, for random Gaussian matrices $$\mu(A) \sim \sqrt{2\log n/m}$$

the condition on the coherence is satisfied if $m > O(\log^3 n)$.

Combining the bounds, it is required that m be $$m \geq \min\{O(k \log n), O(\log^3 n)\}.$$

Orthogonal Matching Pursuit (OMP) is a greedy algorithm aiming at recovering sparse vectors x from noiseless measurement y=Ax. The algorithm outputs a subset of columns of A, by iteratively selecting the column minimizing the residual error of approximating y by projecting to the linear span of already selected columns. It is shown that OMP recovers k-sparse signals from noiseless measurements if the mutual coherence of the measurement matrix A satisfies $$\mu(A) < \frac{1}{2k-1}.$$

There are algorithms developed for LASSO, inspired by proximal algorithms for non-smooth convex optimization: ISTA is a proximal gradient method, FISTA is an accelerated proximal gradient method, and SALSA is an application of the alternative direction method of multipliers.

For error defined as $G(x_t)-G(x^*)$ where $G(x)$ is the objective function of LASSO in equation (4) and $x^*=\arg\min G(x)$, the error decays as $1/t$ for ISTA, $1/t^2$ for FISTA and $1/t^2$ for SALSA where t is the number of iterations. In the art is also known a Newton-type method for non-smooth convex optimization, in which the convergence rate is no worse than $1=t^2$, but is locally quadratic.

The signal of interest is an infinite sequence, $\{x_i\}_{i=0,1,\ldots}$, as is the case when dealing with streaming data. For such a signal of interest the ith window taken from the streaming signal is defined as $$x^{(i)}:=[x_i x_{i+1} \ldots x_{i+n-1}]^T$$

If $x^{(i)}$ is known to be sparse, the tools surveyed above are applicable to recover the signal portion in each window, hence the data stream. However, the involved operations are costly, and an efficient online implementation is uncertain.

Therefore, in accordance with the present invention, a method for efficiently sampling and recovering streaming data is proposed. Such a method is a recursive compressed sensing method, and it will be described in detail bellow. As it will be shown in detail further in this document, the method of the invention exhibits low complexity in both the sampling and estimation parts, which makes its algorithms suitable for an efficient online implementation.

With $\{x_i\}$ is indicated the infinite sequence $\{x_i\}_{i=0,1,\ldots}$, and with $x^{(i)} \in R^n$ the ith window of length n.

A dynamical model with input in R is represented as $$x^{(i)} = \begin{bmatrix} 0 & 1 & 0 & \ldots & 0 \\ 0 & 0 & 1 & \ldots & 0 \\ \vdots & \vdots & \vdots & \ddots & \vdots \\ 0 & 0 & 0 & \ldots & 1 \\ 0 & 0 & 0 & \ldots & 0 \end{bmatrix} x^{(i-1)} + \begin{bmatrix} 0 \\ 0 \\ \vdots \\ 0 \\ 1 \end{bmatrix} x_{i+n-1} \quad (6)$$

The method of the present invention allows the design of a robust low-complexity sliding-window algorithm which provides estimates $\{\hat{x}_i\}$ using successive measurements $y^{(i)}$ of the form $$y^{(i)} = A^{(i)} x^{(i)} \quad (7)$$

where $\{A^{(i)}\}$ is a sequence of measurement matrices. The design of a robust low-complexity sliding-window algorithm is possible if $\{x_i\}$ is sufficiently sparse in each window, namely if $\|x^{(i)}\|_0 \leq k$ for each i, where $k \ll n$ or if this condition is respected with sufficiently high probability.

If $A^{(i)}$ satisfies the restriction isometry property with $\delta_{2k} \leq \sqrt{2}-1$, the methods reviewed earlier in this document may be applied to progressively estimate $\{x^{(i)}\}$. Running such algorithm online is costly and therefore, it is desirable to design an alternative to such a method that at best may be qualified as ad-hoc.

In accordance with the present invention, the signal overlap between successive windows is leveraged, consisting of recursive sampling (an encoding step) and recursive estimation (a decoding step) as follows:

Regarding the step of recursive sampling: To avoid a matrix multiplication for each y(i), A(i) is designed such that y(i) can be reused in computing y(i+1) with minimal computation overhead:

$$y^{(i+1)} = f(y^{(i)}, x_{i+n}, x_i).$$

Regarding the step of recursive estimation: In order to speed up the convergence of an iterative optimization scheme, use is made of the estimate corresponding to the previous window, $\hat{x}^{(i-1)}$, to derive a starting point, $\hat{x}_{[0]}^{(i)}$ of the estimation procedure of $\hat{x}^{(i)}$:

$$\hat{x}_{[0]}^{(i)} = g(\hat{x}^{(i-1)}, \hat{y}^{(i)}).$$

In the following both steps of recursive sampling and recursive estimation will be described in more detail.

Regarding the step of recursive sampling, a recursive sampling scheme featuring minimal computational overhead is proposed. In the first iteration, t=0, there is no prior estimate, therefore what is computed is $$y^{(0)} = A^{(0)} x^{(0)}.$$

A sequence of sensing matrices $A^{(i)}$ recursively is chosen as:

$$A^{(i+1)} = [a_2^{(i)} a_3^{(i)} \ldots a_n^{(i)} a_1^{(i)}] = A^{(i)} P \quad (8)$$

where $a_l^{(i)}$ is the lth column of $A^{(i)}$, and P is the permutation matrix:

$$P := \begin{bmatrix} 0 & \ldots & 0 & 1 \\ 1 & \ldots & 0 & 0 \\ \vdots & \ddots & \vdots & \vdots \\ 0 & \ldots & 1 & 0 \end{bmatrix}$$

The following lemma ensures the success of this encoding scheme: If $A^{(0)}$ satisfies the restrictive isometry property for given k with constant $\delta_k$, then $A^{(i)}$ as defined in equation (8) above satisfies as well the restrictive isometry property, for the same k, and $\delta_k$.

It follows from equation (8) that $A^{(i)} = A^{(0)} P^i$, and $A^{(i)}$ is obtained by reordering the columns of $A^{(0)}$. By definition, the restrictive isometry property depends only on $\|x\|_0$, and is insensitive to permutations of the entries of x, equivalently permutations of the columns of $A^{(0)}$.

Given the particular recursive selection of $A^{(i)}$, $y^{(i+1)}$ is computed as:

$$y^{(i+1)} = A^{(i+1)} x^{(i+1)}$$
$$= \sum_{l=1}^{n} x_{i+l} a_l^{(i+1)}$$
$$= \sum_{l=1}^{n-1} x_{i+l} \underbrace{a_l^{(i+1)}}_{a_{l+1}^{(i)}} + x_{i+n} \underbrace{a_n^{(i+1)}}_{a_1^{(i)}}$$
$$= \sum_{l=2}^{n} x_{i-1+l} a_l^{(i)} + x_i a_1^{(i)} - x_i a_1^{(i)} + x_{i+n} a_1^{(i)} =$$
$$= y^{(i)} + (x_{i+n} - x_i) a_1^{(i)}.$$

When the signal of interest comprises noise, the noisy measurements are noted as $$y^{(i)} = b^{(i)} + w^{(i)} \text{ where } b^{(i)} = A^{(i)} x^{(i)}$$

Therefore, $$b^{(i+1)} = A^{(i+1)} x^{(i+1)} = b^{(i)} + (x_{i+n} - x_i) a_1^{(i)}$$

By substituting the value of $b^{(i+1)}$ in the equation for $y^{(i+1)}$ what is obtained is:

$$y^{(i+1)} = b^{(i+1)} + w^{(i+1)} = b^{(i)} + (x_{i+n} - x_i) a_1^{(i)} + w^{(i+1)} = y^{(i)} + (x_{i+n} - x_i) a_1^{(i)} + w^{(i+1)} - w^{(i)}$$

By defining $z^{(i)} := w^{(i)} - w^{(i-1)}$, $z^{(i)}$ and $z^{(i+1)}$ are independent if $\{w^{(i)}\}$ is an independent increment process.

The particular selection of the sampling matrices $\{A^{(i)}\}_{i=0,1,\ldots}$ given in equation (8) satisfies the condition $$A^{(i)} x^{(i)} = A^{(0)} P^i x^{(i)}$$

By defining $v^{(i)}$ as $v^{(i)} := P^i x^{(i)}$ recursive sampling can be viewed as encoding $v^{(i)}$ by using the same measurement matrix $A^{(0)}$. With the particular structure of $x^{(i)}$ given in equation (6), all of the entries of $v^{(i)}$ and $v^{(i-1)}$ are equal except $v_{i-1}^{(i)}$.

For the recursive estimation of the signal of interest an estimate for $\hat{x}^{(i+1)} = [\hat{x}_{i+1}^{(i+1)} \ldots \hat{x}_{i+n}^{(i+1)}]$ is found by leveraging the extimate $\hat{x}^{(i)} = [\hat{x}_i^{(i)} \ldots \hat{x}_{i+n-1}^{(i)}]$.

In an iterative algorithm, convergence speed depends on the distance of the starting point to the optimal solution. To attain accelerated convergence, the overlap between the windows is leveraged and the following starting point is used:

$$x_{[0]}^{(i)} = [\hat{x}_2^{(i-1)} \hat{x}_3^{(i-1)} \ldots \hat{x}_{n-1}^{(i-1)} E_{x(i-1)}[x_{i+n-1}]]^T$$

where $\hat{x}_j^{(i-1)}$ for $j=2,\ldots,n-1$ is the portion of the optimal solution based on the previous window. This is referred to as 'warm start' in the optimization literature. By choosing the starting point as such, the expected number of iterations for convergence is reduced. This will be actually demonstrated in a later portion of this document where the quantitative results are specifically discussed.

In the following the sparse signals of interest are discussed as they are in a given orthonormal basis.

So far in this document it was implicitly assumed that for a given $n \in Z^+$, windows $x^{(i)}$ of length n obtained from the sequence $\{x_i\}$ satisfy the sparsity constraint $\|x^{(i)}\|_0 \leq k$, $\forall i$. In general, it might be the case that $x^{(i)}$ is not sparse itself, but can be sparsely represented in a properly selected basis.

$x^{(i)} \in R^n$ is sparsely representable in a given orthonormal basis $\Phi$ as $x^{(i)} = \Phi \alpha^{(i)}$, where $\alpha^{(i)}$ is sparse.

Assuming a common basis for the entire sequence $\{x_i\}$ over windows of size n, what is obtained is:

$$y^{(i)} = A^{(i)} x^{(i)} = A^{(i)} \Phi \alpha^{(i)}.$$

For the compressed sensing estimation to carry over, $A^{(i)} \Phi$ needs to satisfy the restricted isometry property. The restricted isometry property is satisfied with high probability for the product of a random matrix $A^{(i)}$ and any fixed matrix. In this case the LASSO problem for recovering the signal in the sparsity basis, $\alpha^{(i)}$ is expressed as:

minimize $\|A^{(i)} \Phi \alpha^{(i)} - y\|_2^2 + \lambda \|\alpha^{(i)}\|_1$ where the input signal is given by $x^{(i)} = \Phi \alpha^{(i)}$.

The problem that needs to be solved is how to find a recursive update for $\alpha^{(i+1)}$ based on $\alpha^{(i)}$ so as to have a good initial estimate for accelerated convergence in recursive estimation, as $E[\alpha^{(i+1)} | \alpha^{(i)}]$.

Using equation (6) what is obtained is:

$$x^{(i+1)} = \prod x^{(i)} + \begin{bmatrix} 0_{n-1} \\ 1 \end{bmatrix} (x_{i+n} - x_i)$$

where $0_{n-1}$ is vector of length n−1 having all elements set to 0.

Since $x^{(i)} = \Phi \alpha^{(i)}$, it is obtained:

$$x_i = x_0^{(i)} = [1 1 0_{n-1}] \Phi \alpha^{(i+1)} \text{ and}$$

$$x_{i+1} = x_{n-1}^{(i+1)} = [0_{n-1} | 1] \Phi \alpha^{(i+1)}.$$

Left multiplying both sides by $\Psi = \Phi^{-1}$ in the previous equation, it follows:

$$\alpha^{(i+1)} = \Psi x^{(i-1)} = \Psi \prod x^{(i)} + \Psi \begin{bmatrix} 0_{n-1} \\ 1 \end{bmatrix} (x_{i+n} - x_i) = \qquad (11)$$

$$= \Psi \prod x^{(i)} + (x_{i+n} - x_i) \psi_{n-1} =$$

$$= \Psi \prod \Phi \alpha^{(i)} + \psi_{n-1} ((\phi_{n-1}^T)^T \alpha^{(i+1)} - (\phi_0^T)^T \alpha^{(i)})$$

where $\Pi := P^T$ is the permutation matrix given in equation (9), and $(\phi_0^T)^T$ and $(\phi_{n-1}^T)^T$ are the first and the last rows of the orthonormal basis $\Phi$, respectively.

The Fourier basis is of particular interest for $\Phi$ since an efficient update rule can be derived for such basis. The Recursive Sampling for Fourier Basis is as follows:

If $\Phi$ is the n×n inverse Discrete Fourier Transform (IDFT) matrix with entries $$\Phi_{i,j} = \omega^{(i-1)(j-1)} / \sqrt{n}$$

where $\omega := e^{j2\pi/n}$, in such case:

$$\alpha^{(i+1)} = \Omega_n \alpha^{(i)} + \psi_{n-1} ((\Phi_{n-1}^T)^T \alpha^{(i+1)} - (\Phi_0^T)^T \alpha^{(i)}) \qquad (12)$$

where $\Omega_n$ is the n×n diagonal matrix with $(\Omega_n)_{i,i} = \omega^{-(i-1)}$, and $\Psi = \Phi^{-1}$ is the orthonormal Fourier basis.

In this particular case, the equation (11) simplifies to equation (12) since circular shift in the time domain corresponds to multiplication by complex exponentials in the Fourier domain, as $\Psi \Pi = \Omega_n \Psi$ and $\Psi \Phi = I$.

From the above it may be seen that although the number of computations for calculating $\alpha^{(i+1)}$ based on $\alpha^{(i)}$ is $O(n^2)$ in general, for Fourier basis it is $O(n)$ since the matrix that multiplies $\alpha^{(i)}$ is diagonal.

As shown earlier, in the presence of noise, the estimate of $E[\alpha^{(i+1)} | \alpha^{(i)}]$ is used as the starting point in the iterative LASSO solver for warm start, in order to attain accelerated convergence.

One way to improve error variance is by averaging the estimates obtained from successive windows. Using the estimates $\hat{x}^{(i)}$, the average estimate, $\bar{x}_i$, is defined for the ith entry of the streaming signal, i.e. $x_i$, as:

$$\bar{x}_i := \frac{1}{\min\{i+1, n\}} \sum_{j=\max\{0, i-n+1\}}^{i} \hat{x}_{i-j}^{(j)} \qquad (13)$$

where we average n many estimates for $i \geq n-1$ and $i+1$ many estimates for $i < n-1$.

Considering $i \geq n-1$ for notational simplicity, what is further obtained is:

$$\frac{1}{n} \sum_{j=i-n+1}^{i} (\hat{x}_{i-j}^{(j)} - x_i)^2 \overset{(a)}{\geq} \left( \frac{1}{n} \sum_{j=i-n+}^{i} (\hat{x}_{i-j}^{(j)} - x_i) \right)^2 = (\bar{x}_i - x_i)^2$$

where (a) follows from Jensen's inequality applied to $x^2$. The inequality implies that the reconstruction error can only be lowered by averaging the estimates.

In the following, the expected $l_2$-norm of the reconstruction error $|\bar{x}-x_i|^2$ is analyzed, by expanding the equation and using $$Cov[\hat{x}_{j+1}^{(i-j)}, \hat{x}_{k+1}^{(i-k)}]=0 \text{ for } j \neq k.$$

For notational convenience the case $i \geq n-1$ is considered, the case $i < n-1$ being similar.

$$E_x[(\bar{x}_i - x_i)^2] = E_x\left[\left(\frac{1}{n}\sum_{j=i-n+1}^{i}\hat{x}_{i-j}^{(j)} - x_i\right)^2\right]$$

$$= \left(E_x[\hat{x}_1^{(i)}] - x_i\right)^2 + \frac{1}{n}E_x\left[(\hat{x}_1^{(i)} - E_x[\hat{x}_1^{(i)}])^2\right]$$

The resulting equality is the so called bias-variance decomposition of the estimator. It is seen that as the window length is increased the second term approaches zero and the reconstruction error asymptotically converges to the square of the bias of LASSO.

In the following the algorithm proposed in accordance with the present invention will be discussed.

In general, the least absolute selection and shrinkage operator (LASSO) yields a biased estimator as it maps $R^m \to R^n$ where $m \leq n$. If the overlaps between windows are utilized by averaging the LASSO estimates directly, the reconstruction error does not go to zero due to bias. On the other hand, least squares estimation (LSE) is an unbiased estimator for an overdetermined system; as shown above in this document, LASSO can be used for estimating the support set of the signal on which LSE can be subsequently applied. Based on these observations, a two-step estimation procedure is proposed for recovering the sampled signal to reduce the estimation error. First, the LASSO estimates $\hat{x}^{(i)}$ are obtained, which are then used as input to a de-biasing algorithm. For de-biasing, the LSE is performed on the support set of the LASSO estimate to obtain $\tilde{x}^{(i)}$, which gives an unbiased estimator of the true non-zeroes of the signal when $\|x^{(i)}\|_0 \leq m$ and support is identified correctly. Subsequently the de-biassed estimates obtained over successive windows are averaged. The block diagram of the method and the pseudocode for the algorithm can be seen in the adjoined figures and Algorithm 1 below, respectively.

---
Algorithm 1 Recursive compressed sensing:
---

Input: $A^{(0)} \in R^{m \times n}$, $\{x\}$, $\lambda \geq 0$
Output: estimate $\{\bar{x}\}$
1. support selection counts: $\{v\} \leftarrow \{0\}$, signal signal estimate: $\{\bar{x}\} \leftarrow \{0\}$
2. for $i = 0, 1, 2, \ldots$ do
3. $x^{(i)} \leftarrow (x_i x_{i+1} \ldots x_{i+n-1})^T$
4. $y(i) \leftarrow A^{(i)} x^{(i)} - w^{(i)}$ ▶encoding
5. $\hat{x}^{(i)} \leftarrow \arg\min_{x \in R^n} \|A^{(i)}x - y^{(i)}\|_2^2 + \lambda\|x\|_1$ ▷ LASSO
6. $I \leftarrow \sup p(\hat{x}^{(i)})$ ▷ support estimation
7. $v_{I+i} \leftarrow v_{I+i} + 1$ ▷ increase count of selection in support
8. $\tilde{x}^{(i)} \leftarrow \arg\min_{x \in R^{|I|}} \|A_I^{(i)}x - y^{(i)}\|_2^2$ ▷ LSE on support set ---
Algorithm 1 Recursive compressed sensing:
---

9. $\bar{x}_I^{(i)} \leftarrow ((v_I^{(i)} - 1) \otimes \bar{x}_I^{(i)} + \tilde{x}^{(i)}) \oslash$ ▷ update average estimate where the zero crossed operators denote element-wise multiplication and division respectively
10. $A^{(i)} \leftarrow A^{(i-1)} P$ ▷ for recursive sampling
11. end.

A block diagram of the method for sensing streaming data in accordance with one embodiment of the present invention is represented in FIG. 1. A method according to this embodiment comprises the step of recursively sampling an input stream of data using the steps of overlapping windowing to obtain at least a previous measurement, and employing said previous measurement for obtaining a subsequent measurement. More precisely, the method comprises the step of recursive sampling 102 of an input stream of data. The data sampled during the step of recursive sampling 102 is processed via a recursive estimation step 104. Information regarding a previous estimate, obtained during a previous estimate obtention step 116 previous to the recursive sampling is as well imputed during the step of recursive estimation 104. The data obtained during the step of recursive estimation 104 is utilized during the step of support detection 106, as described above in connection with step 6 of the recursive sampling algorithm. The information processed as the result of the support detection step may be used for count estimation, as shown in step 110 of FIG. 1 and as corresponding to step 7 of the recursive sampling algorithm. The information obtained in step 106 is utilized during the step 108 of calculating the LSE on the support set, as described above in connection with step 8 of the recursive sampling algorithm. Subsequently the LSE on the support set and the estimation count are averaged in step 112, as described above in connection with step 9 of the recursive sampling algorithm. In accordance with an embodiment of the method, the previous estimate obtained during the step 116 is as well averaged in step 112. A new estimate is obtained in step 114, as described above in connection with step 10 of the recursive sampling algorithm.

The method according to one such embodiment is as well capable of analyzing the computational complexity and estimation error of the method.

More precisely, in the following the complexity and error variance of the method are analyzed, and a voting algorithm for more robust support detection is introduced.

The block diagram of FIG. 1 representing one embodiment of the method may be extended to a method comprising variable overlap between successive windows.

What is taken under consideration is a generalization in which sensing is performed via recurring windowing with $0 < \tau \leq n$ overlaps.

If $A \in R^{m \times n}$ denotes the sampling matrix, i denotes the window index, and $\eta_i$ is the sampling efficiency, that is the ratio of total samples taken until time (n+i) to the number of entries sensed. For one window, the sampling efficiency is m/n since sampling matrix is $A \in R^{m \times n}$.

By the end of ith window, $n+(i-1)_\tau$ elements have been recovered while having taken im samples. The asymptotic sampling efficiency is:

$$\eta := \lim_{i \to \infty} \eta_i = \lim_{i \to \infty} \frac{im}{n+(i-1)\tau} = \frac{m}{\tau}$$

If instead the encoding used in en encoding using a rank-τ update, i.e., by using the matrix obtained by circular shifting the sampling matrix τ times, the asymptotic sampling efficiency becomes:

$$\eta = \lim_{i \to \infty} \frac{m+(i-1)\tau}{n+(i-1)\tau} = 1$$

In the latter case, the recursive sampling approach is asymptotically equivalent to taking one sample for each time instance. The benefit of such approach lies in noise suppression. By taking overlapping windows each element is sensed at minimum $\lfloor n/\tau \rfloor$-many times, hence collaborative decoding using multiple can be used to increase estimation accuracy.

The application of LASSO to signal support estimation was discussed earlier in this document. Further in this document a method utilizing the estimated support over successive windows for more robust support detection in high measurement noise is introduced. When the signal magnitudes are not high enough to stand above the noise level, the aforementioned support detection mechanism may miss nonzero positions (false negative) or detect false support (false positive). Therefore the support detection theorem discussed earlier in this document could use a smaller regularization constant, λ, to detect support for lower minimum nonzero values with a cost of reducing the success probability. Assuming that the false positives are randomly distributed on the set $\{0, \ldots, n-1\} \setminus \text{supp}(x^{(i)})$ for all i, by introducing a threshold on the minimum number of times a position needs to be detected as support, we can decrease the false positives in low signal to noise regime.

By introducing a 'voting machine' the obtained two step algorithm with voting may be represented within the support detection block 106 in FIG. 1. The two step algorithm works by solving LASSO as $$\hat{x}^{(i)} = \arg\min_{x \in R^n} (\|A^{(i)}x - y^{(i)}\|_2^2 + \lambda\|x\|_1).$$

If $\xi_1$ is set as >0, the indices where absolute value of $\hat{x}^{(i)}$ is greater than $\xi_1$ are found to estimate the support of $x^{(i)}$; in the ith window $$S_t^{(i)} = \{j : |\hat{x}_j^{(i)}| \geq \xi_1\}.$$

The sequence containing the votes is defined as $\{v_i\}$ and the number of times an index i is used in the least squares estimation (LSE) as $\{L_1\}$. At the beginning of the algorithm the $\{v_i\}$ and the $\{L_1\}$ are set to zero. For each window, votes on the positions that are in the set are added, the set being indicated by $S_t^{(i)}$ as $v_{S_t^{(i)}+1} \leftarrow v_{S_t^{(i)}+1}+1$, where the subscript $S_t^{(i)}+i$ is used to translate the indices within the window to global indices on the streaming data. By applying threshold $\xi_2 \in Z^+$ on the number of votes $\{v_i\}$, the indices that have been voted sufficiently many times to be accepted as nonzeros are found and they are stored in $$S_g^{(i)} = \{j : v_{j+i} \geq \xi_2\}.$$

The threshold $\xi_2$ is chosen so that $|S_g^{(i)}| < m$, hence yielding an overdetermined system for the LSE. The overdetermined least squares problem is solved based on these indices, $$\hat{x}^{(i)} = (A_{S_g^{(i)}}^{(i)T} A_{S_g^{(i)}}^{(i)})^{-1} A_{S_g^{(i)}}^{(i)T} y^{(i)}$$

where $A_{S_g^{(i)}}^{(i)}$ is the matrix obtained by extracting columns of $A^{(i)}$ indexed by the set $S_g^{(i)}$. Then in order to perform averaging of the least squares estimates, the number of recoveries is incremented for the entries used in LSE procedure as $$L_{S_g^{(i)}+i} \leftarrow L_{S_g^{(i)}+i}+1.$$

The vector $\tilde{x}^{(i)}$ is in $R^{|S_g^{(i)}|}$ and the vector $x' \in R^n$ is generated by setting the elements indexed by the $S_g^{(i)}$ to the least squares estimate as $x'_{S_g^{(i)}} = \tilde{x}^{(i)}$ and all the other indexes to 0. Then the average estimates are updated as:

$$\bar{x}_{i+j} \leftarrow \frac{L_i-1}{L_i}\bar{x}_{i+j} + \frac{1}{L_i}x'_j \quad \text{for } j=0,1,\ldots,n-1.$$

The estimation error variance and the computational complexity of the method according to one embodiment is analyzed in the following.

Before the analysis of the estimation error variance of the two step RCS method is made, the following lemma is introduced:

Lemma 5.1: Denoting the solution to LASSO in equation (4) by $\hat{v}$, its support set by $I:=\text{supp}(\hat{v})$, and the least squares solution restricted to columns $A_I$ by $$\tilde{v} := \arg\min_{\substack{v \in R^n \\ v_{I^c}=0}} \|Av - y\|_2^2,$$

the following equation is satisfied:

$$\|A_I(\tilde{v}_I - \hat{v}_I)\|_2^2 \leq (\|\tilde{v}_I\|_1 - \|\hat{v}_I\|_1)\frac{\lambda}{2}.$$

Independent of the selected support, the following holds for LASSO estimation and least squares applied on the support of LASSO estimate:

$$\hat{v} = \arg\min_{v \in R^n} \|Av - y\|_2^2 + \lambda\|v\|_1 = \arg\min_{\substack{v \in R^n \\ v_{I^c}=0}} \|Av - y\|_2^2 + \lambda\|v\|_1$$

$$\tilde{v} = \arg\min_{\substack{v \in R^n \\ v_{I^c}=0}} \|Av - y\|_2^2$$

where $I=\text{supp}(\hat{v})$. The optimality conditions of LASSO yield:

$$A_I^T(y - A_I\hat{v}_I) = \frac{\lambda}{2}\text{sgn}(\hat{v}_I) \quad (15)$$

where sgn(v) is the sign function extended to vectors. Normal equations read $$A_I^T A_I \tilde{v}_I = A_I^T y$$

Therefore:

$$\|A_I(\tilde{v}_I^{(i)} - \hat{v}_I^{(i)})\|_2^2 = (\tilde{v}_I - \hat{v}_I)^T A_I^T A_I(\tilde{v}_I - \hat{v}_I)$$

-continued $$\stackrel{(a)}{=} (\tilde{v}_I - \hat{v}_I)^T \frac{\lambda}{2} \text{sgn}(\hat{v}_I) \stackrel{(b)}{\leq} (\|\tilde{v}_I\|_1 - \|\hat{v}_I\|_1) \frac{\lambda}{2} \stackrel{(c)}{=}$$

$$\stackrel{(c)}{=} (\|\tilde{v}\|_1 - \|\hat{v}\|_1) \frac{\lambda}{2}$$

where (a) follows from equation (15) and normal equations, (b) follows from $$\hat{v}_I^T \text{sgn}(\hat{v}_I) = \|\hat{v}_I\|_1 \text{ and}$$

$$\tilde{v}_I^T \text{sgn}(\hat{v}_I) \leq \|\tilde{v}_I\|_1$$

and (c) follows since $\hat{v}_{I^c} = \tilde{v}_{I^c} = 0$.

If it is assumed that noise is uncorrelated irrespective of the support detection, i.e., $\text{Cov}[w^{(i)}, w^{(j)} | A_i, A_j] = 0$ for $i \neq j$ where $A_i$ denotes the event that the support detection succeeds in the ith window, $$A_i := \{\text{supp}(\hat{x}^{(i)}) = \text{supp}(x^{(i)})\}$$

The following theorem gives an upper bound on the reconstruction error variance of the proposed two-step algorithm.

In accordance with the theorem regarding Error Variance for the proposed algorithm, under the conditions discussed above in connection with support detection and under the assumption that the noise is uncorrelated irrespective of the support detection for fixed k and n, the following condition is valid:

$$E[(\bar{x}_1 - x_i)^2] \leq$$

$$P(A) \frac{\sigma^2}{(1-\sqrt{k/m})} + \frac{P(A^c)}{n} \sum_{i=0}^{n-1} E\left[\frac{\lambda(\|\tilde{x}_I^{(i)}\|_1 - \|\hat{x}_I^{(i)}\|_1)}{2(1-\sqrt{k/m})} + \|\hat{x}^{(i)} - x^{(i)}\|_2^2\right],$$

where $$P(A) \geq 1 - 2\left(\frac{1}{\sqrt{2\pi \log n}} + \frac{|I|}{n}\right) - \frac{c}{n^{2\log 2 - 1}} \text{ and}$$

$$P(A^c) = 1 - P(A).$$

To demonstrate the validity of the theorem stated above, the following three conditions need to be satisfied:

The first condition is:

Given m, and k where $k \leq m$, for m×k matrix A where $A_{i,j} \sim N(0, 1/m)$, the singular values $s_1(A) \geq \ldots \geq s_k(A)$ satisfy the condition:

$$\max\{P(s_1(A) \geq 1 + \sqrt{k/m} + t), P(s_k(A) \leq 1 - \sqrt{k/m} - t)\} < \exp(-mt^2/2)$$

The second condition is:

$$P(A_i) \geq 1 - \frac{2}{n}\left(\frac{1}{\sqrt{2\pi \log n}} + \frac{|I_x|}{n}\right) - O\left(\frac{1}{n^{2\log 2}}\right).$$

By the union bound, $$P\left(\bigcap_{i=1}^n A_i\right) = 1 - P\left(\bigcup_{i=1}^n A_i^c\right) \geq 1 - 2\left(\frac{1}{\sqrt{2\pi \log n}} + \frac{|I|}{n}\right) - \frac{c}{n^{2\log 2 - 1}}$$

$\hat{v}^{(i)}$ is defined as the Lasso estimate. It is obtained by least squares applied on the support of Lasso, $\hat{v}^{(i)}$.

The LASSO estimate is defined, $\hat{v}^{(i)}$, and the estimate is obtained by least squares applied on the support of LASSO, $\tilde{v}^{(i)}$ as:

$$\hat{v}^{(i)} = \underset{v \in R^n}{\arg\min} \|Av - y^{(i)}\|_2^2 + \lambda \|v\|_1$$

$$\tilde{v}^{(i)} = \underset{\substack{v \in R^n \\ v_{I^c} = 0}}{\arg\min} \|Av - y^{(i)}\|_2^2$$

where $I = \text{supp}(\hat{v}^{(i)})$.

In the event where the support in all n consecutive windows is correctly detected, $A_1 \cap \ldots \cap A_n$, the ordinary least squares estimate is $$\tilde{v}^{(i)} = (A_{I^{(i)}}^T A_{I^{(i)}})^{-1} A_{I^{(i)}}^T y^{(i)}.$$

The matrix $A_{I^{(i)}}^T A_{I^{(i)}}$ is invertible since the singular values of $A_{I^{(i)}}$ are nonzero with high probability.

From standard LSE, $E[\tilde{v}^{(i)}] = v_{I^{(i)}}$ and $\text{Cov}[\tilde{v}^{(i)}] = \sigma^2 (A_{I^{(i)}}^T A_{I^{(i)}})^{-1}$.

For any fixed entry, such as $v_{n-1} = x_{n-1}$ which is the first entry in the signal that is estimated n times, given $A_0^{n-1} := A_0 \cup \ldots A_{n-1}$:

$$E_v\left[\left(\frac{1}{n}\sum_{i=0}^{n-1} \tilde{v}_{n-1}^{(i)} - v_{n-1}\right)^2 \bigg| A_0^{n-1}\right] = \frac{1}{n^2}\sum_{i=0}^{n-1} E_v\left[(\tilde{v}_{n-1}^{(i)} - v_{n-1})^2 \big| A_0^{n-1}\right] +$$

$$\frac{1}{n^2}\sum_{i=0}^{n-1}\sum_{\substack{j=0 \\ j \neq i}}^{n-1} E_v\left[(\tilde{v}_{n-1}^{(i)} - v_{n-1})(\tilde{v}_{n-1}^{(j)} - v_{n-1}) \big| A_0^{n-1}\right] =$$

$$\frac{1}{n^2}\sum_{i=0}^{n-1} E_v\left[(\tilde{v}_{n-1}^{(i)} - v_{n-1})^2 \big| A_0^{n-1}\right] = \frac{1}{n^2}\sum_{i=0}^{n-1} \sigma^2 \begin{bmatrix} 0 \\ 1 \end{bmatrix}^T (A_{I^{(i)}}^T A_{I^{(i)}})^{-1} \begin{bmatrix} 0 \\ 1 \end{bmatrix} \leq$$

$$\frac{1}{n^2}\sum_{i=0}^{n-1} \sigma^2 \frac{1}{\sigma_k(A_{I^{(i)}})} \leq \frac{\sigma^2}{n(1-\sqrt{k/m})}$$

m~k log (n/k)

This value for m decreases as almost 1/n hence the reconstruction variance goes to zero in the case where the support detection succeeds in n consecutive windows.

In the third place, it is important to know happens in the complement of previous case, $$\left(\bigcap_{i=1}^n A_i\right)^c.$$

For $\hat{v}^{(i)}$ and $\tilde{v}^{(i)}$ the lemma above yields:

$$\|A_I(\tilde{v}_I^{(i)} - \hat{v}_I^{(i)})\|_2^2 \leq (\|\tilde{v}_I^{(i)}\|_1 - \|\hat{v}_I^{(i)}\|_1)\frac{\lambda}{2}$$

Therefore:

$$\|\tilde{v}_I^{(i)} - \hat{v}_I^{(i)}\|_2^2 \leq (\|\tilde{v}_I^{(i)}\|_1 - \|\hat{v}_I^{(i)}\|_1)\frac{\lambda}{2(1-\sqrt{k/m})}$$

Using the triangle inequality we get an upper bound for the 2-norm of the difference between LSE estimate on the support set and the true signal:

$$\|\tilde{v}^{(i)} - v^{(i)}\|_2^2 \leq \|\tilde{v}^{(i)} - \hat{v}^{(i)}\|_2^2 + \|\hat{v}^{(i)} - v^{(i)}\|_2^2 \leq \quad (16, 17)$$

$$\frac{\lambda(\|\tilde{v}_I^{(i)}\|_1 - \|\hat{v}_I^{(i)}\|_1)}{2(1 - \sqrt{k/m})} + \|\hat{v}^{(i)} - v^{(i)}\|_2^2$$

By combining these results what is obtained is:

$$E[(\bar{v}_{n-1} - v_{n-1})^2] = E\left[\left(\frac{1}{n}\sum_{i=0}^{n-1}(\tilde{v}_{n-1}^{(i)} - v_{n-1})\right)^2\right] \leq$$

$$E\left[\frac{1}{n}\sum_{i=0}^{n-1}(\tilde{v}_{n-1}^{(i)} - v_{n-1})^2\right] \leq \frac{1}{n}\sum_{i=0}^{n-1} E[\|\tilde{v}^{(i)} - v^{(i)}\|_2^2]$$

The equation above is obtained by substituting inequality 17, using probabilities for $A_0''$ and $(A_0'')^c$, and noting that v, $\tilde{v}$, and $\hat{v}$ can be interchanged with x, $\tilde{x}$ and $\hat{x}$ respectively.

In the following the computational complexity of the recursive compressed sensing algorithm will be analyzed.

If i is the window index, $A^{(i)} \in R^{m \times n}$ is the sampling matrix, and $\tau$ is indicative of the sliding step the number of sliding slots between successive windows, by the end of the ith window $n+(i-1)\tau$ entries have been recovered.

The first window is sampled by $A^{(0)}x^{(0)}$. This requires O(mn) basic operations, such as additions and multiplications. After the initial window, sampling of the window $$x^{(i)} = [x_{i\tau} x_{i\tau+1} \ldots x_{i\tau+n-1}]$$

is achieved by recursive sampling having rank $\tau$ update with complexity $O(m\tau)$. Thus by the end of the ith window, the total complexity of sampling is $O(mn)+O(m\tau)i$, for an average complexity of $O(m\tau)$ for recursive sampling.

The other contribution to computational complexity stems from the iterative solver. The expected complexity attributes to the iterative solver which can be calculated as the number of operations in each iteration times the expected number of iterations for convergence. While the former depends on the particular algorithm the later is a function of the distance of the starting point to the optimal solution, which is bound to the case of using recursive estimation as follows:

Using:

$$\hat{x}_{[0]}^{(i)} = [x_{*\tau}^{(i-1)} \ldots x_{*n-1}^{(i-1)} 0_\tau^T]^T$$

As the starting point, what is obtained is:

$$\|\hat{x}_{[0]}^{(i)} - x_*^{(i)}\|_2 \leq C_0 \|x^{(i-1)} - x_k^{(i-1)}\|_1/\sqrt{k} + C_0\|x^{(i)} - x_k^{(i)}\|_1/\sqrt{k} + C_1\tilde{\sigma} + \|[x_{n-\tau}^{(i)} \ldots x_{n-1}^{(i)}]\|_2$$

The validity of the statement made above is proven as follows:

$$e'^{(i)} := [x_{*\tau}^{(i-1)} x_{*n-1}^{(i-1)} 0_\tau^T]^T - [x_{*0}^{(i)} x_{*n-1}^{(i)}]^T$$

$$e^{(i)} := x_*^{(i)} - x^{(i)}$$

$$e'^{(i+1)} = [x_{*\tau}^{(i)} x_{*n-1}^{(i)} 0_\tau^T]^T - x^{(i)} + x^{(i)} - [x_{*0}^{(i)} x_{*n-1}^{(i)}]^T$$

Taking the norm and using triangle inequality yields:

$$\|e'^{(i+1)}\|_2 \leq \|e^{(i-1)}\|_2 + \|e^{(i)}\|_2 + \|[x_{n-\tau}^{(i)} \ldots x_{n-1}^{(i)}]\|_2$$

With view to the theorem that provides the error of Lasso, what is obtained is:

$$\|e'^{(i+1)}\|_2 \leq C_0\|x^{(i-1)} - x_k^{(i-1)}\|_1/\sqrt{k} + C_0\|x^{(i)} - x_k^{(i)}\|_1/\sqrt{k} + C_1\tilde{\sigma} + \|[x_{n-\tau}^{(i)} \ldots x_{n-1}^{(i)}]\|_2 \quad (18)$$

The exact computational complexity of each iteration depends on the algorithm. Minimally, iterative solver for LASSO requires multiplication of sampling matrix and the estimate at the iteration which requires O(mn) operations. In an algorithm where the cost function decays sublinearly (e.g., $1/t^2$), as in FISTA, the number of iterations required for obtaining $\hat{x}$ such that $G(\hat{x}) - G(x_*) \leq \epsilon$ where $x_*$ is the optimal solution, is proportional to $$\frac{\|x_{[0]} - x_*\|_2}{\sqrt{\epsilon}},$$

where x[0] is the starting point of the algorithm. From this bound, it is seen that average number of iterations is proportional to the Euclidean distance of the starting point of the algorithm from the optimal point.

For the sequence $\{x_1\}_{i=0,1,\ldots}$ where $\|x^{(i)}\|_0 \leq k$ and $$\max_{j=0,\ldots,n-1} |x_j^{(i)}| \leq C$$

for all i where C>0 is constant, the expected number of iterations for convergence of algorithms where cost function decays sublinearly is $O(\sqrt{\tau})$ for noiseless measurements and $O(\sqrt{\tau})+O(\sqrt{m})$ for i.i.d. measurement noise.

The above statement is true since: Since $x^{(i)}$ is k-sparse, the terms $\|x^{(i-1)} - x_k^{(i-1)}\|_1$ and $\|x^{(i)} - x_k^{(i)}\|_1$ drop in accordance with equation 18.

By $|x_i| \leq C$, it is obtained $$\|[x_{n-\tau}^{(i)} \ldots x_{n-1}^{(i)}]\|_2 \leq C\sqrt{\tau}.$$

With noisy measurements, the term $C_1\tilde{\sigma}$ is related to the noise level. Since noise has distribution $N(0,\sigma^2 I)$, with high probability $\tilde{\sigma}^2 = \sigma^2(m+\lambda\sqrt{2m})$ thus $\tilde{\sigma} \sim O(\sqrt{m})$ by the conditions advance by the theorem concerned with the error in LASSO. Using this result in equation (18), it is found that the expected number of iterations is $O(\sqrt{\tau})+O(\sqrt{m})$ in the noisy case.

In the above analysis, the average complexity is $O(m\tau)$ for recursive sampling and O(mn) for optimization algorithm (minimally). For recovering each component of the input stream and not leaving out elements, $\tau \leq n$, thus it is seen that complexity of iterative optimization dominates the average complexity.

By using the condition $$m \geq Ck\log\left(\frac{n}{k}\right)$$

for random vectors sampled from unit sphere, random Gaussian matrices and random Bernoulli matrices to satisfy the condition $\delta_{2k} \leq \sqrt{2}-1$. The following tablet shows average computational complexity for various sparsity classes on k.

| k | Computational Complexity |
| --- | --- |
| O(1) | O(n log n) |
| O(log n) | O(n log n · log(n/log n)) |

-continued

| k | Computational Complexity |
|---|---|
| $O(\sqrt{n})$ | $O(n^{3/2} \log n)$ |
| $O(n)$ | $O(n^2)$ |

EXPERIMENTAL RESULTS

The data used in the simulations are generated from the random model:

$$f_x(x) = \begin{cases} (1-p)\delta(x) + \dfrac{1}{2p} & \text{if } x \in [-1, 1] \\ 0 & \end{cases} \quad (19)$$

with p=0.05 unless stated otherwise.
The measurement model is $$y^{(i)} = A^{(i)} x^{(i)} + w^{(i)}$$

with $w^{(i)} \sim N(0, \sigma^2 I)$
where $\sigma > 0$
and the sampling matrix is $$A^{(i)} \in R^{m \times n}$$

where m is six times the expected number of nonzero entries in one window, i.e., m=6 pn, and where n is equal to the window length.

Figure 2:
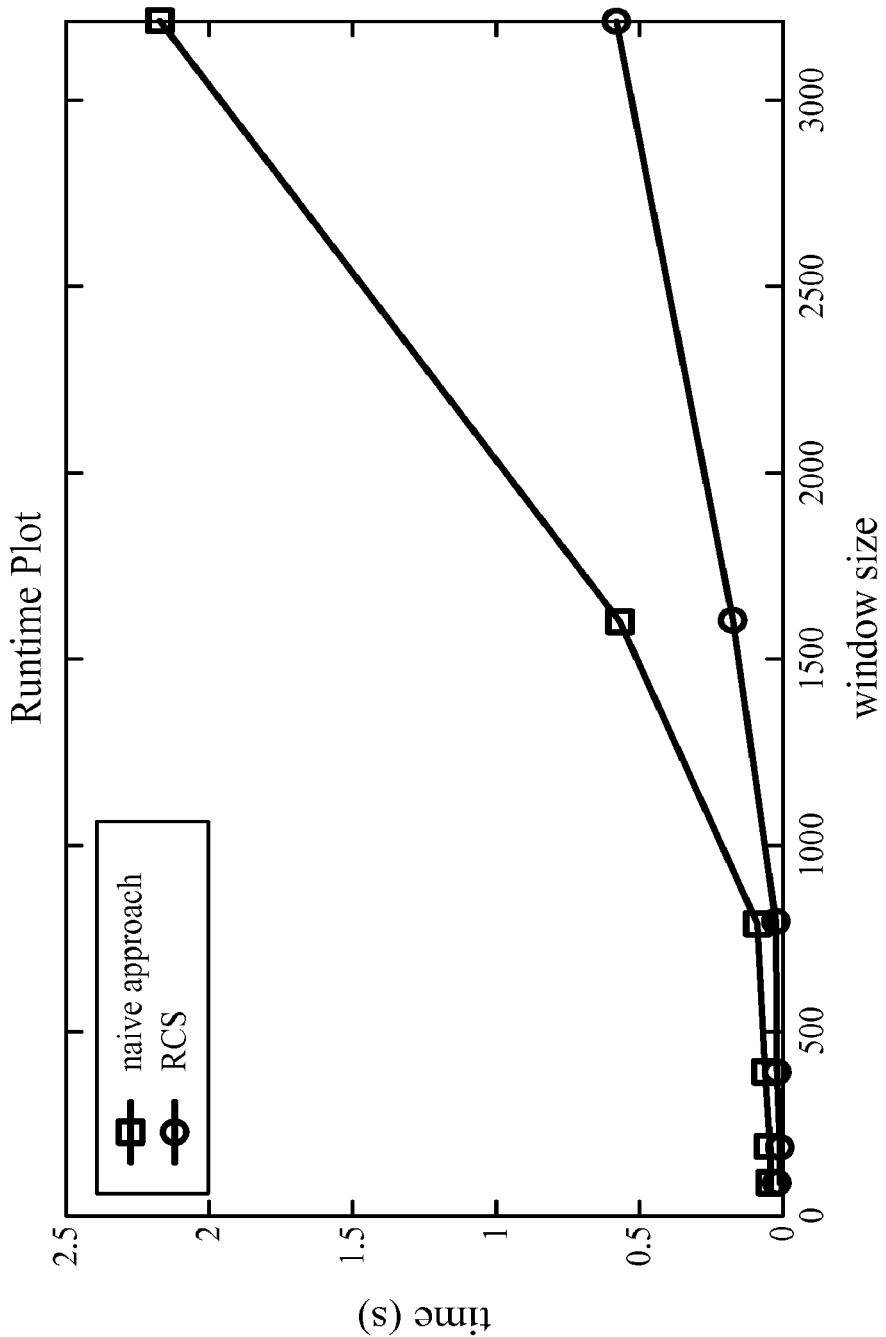
FIG. 2 represents the average processing time for recursive compressed sensing versus a 'naive approach' over a single time window.

It has been experimentally shown what is the speed gain achieved by RCS by comparing the average time required to estimate a given window while using FISTA, the accelerated proximal gradient method, for solving LASSO. RCS is compared against so called 'naive approach', where the sampling is done by matrix multiplication in each window and FISTA is started from all zero vector. The average time required to recover one window in each case is shown in FIG. 2. As it may be observed in FIG. 2 the average processing time for RCS is below the processing time required by other methods.

The results of experiments on the support estimation using LASSO are discussed herewith. In the measurements $x \in R^{6000}$, $\|x\|_0 = 60$, $A \in R^{m \times 6000}$ is generated by a Gaussian distribution with $A_{i,j} \sim N(0, 1/m)$ and w has $\sigma = 0.1$. As suggested in the LASSO theorem, for these parameters, LASSO is solved with $\lambda = 4\sigma \sqrt{2 \log n}$, and the nonzero amplitudes of x satisfies $$\min_{i=1,2,\ldots n} |x_i| \geq 3.34$$

by sampling from U ([−3.34, −4:34] U [3.34, 4.34]).

In simulations, the number of samples taken is varied from the signal, m, and the accuracy of support estimation is studied by using detection rate equal=| detected support ∩ true support versus |/| true support| and a false positive rate=| detected support\ true support |/| true support |, where |·| denotes the cardinality of a set and \ is the set difference operator. Note that with this definition, the false positive rate can be greater than one.

Figure 3:
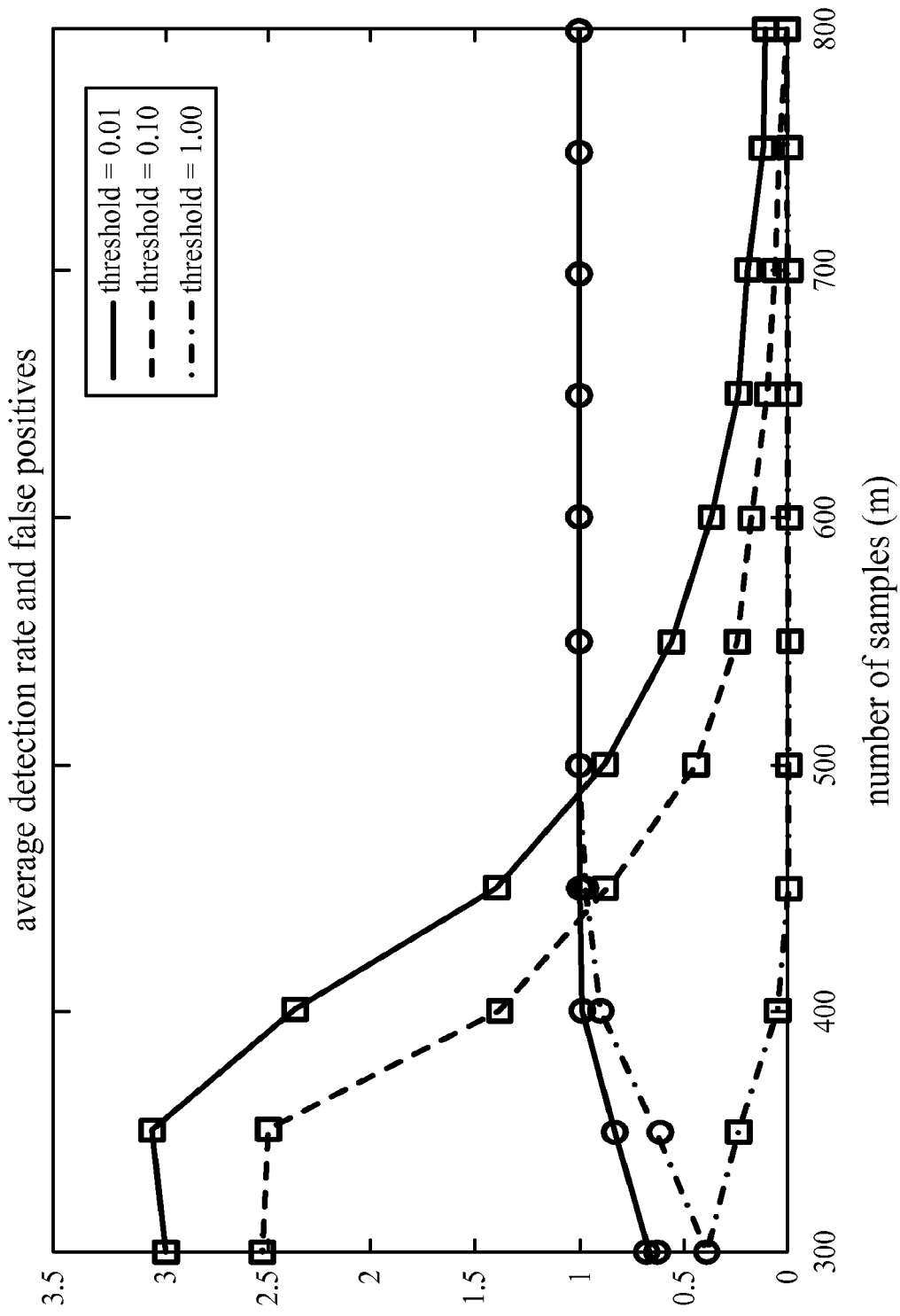
FIG. 3 represents the results of support set estimation using LASSO.

Two methods for support detection are compared. The first method is by solving LASSO and taking the non-zero positions as the support, and the second is by taking the positions where the absolute magnitude of the estimate is greater than a threshold. FIG. 3 shows the resulting curves for the two methods, obtained by randomly generating the input signal 20 times for each value of m and averaging the resulting detection rates and false positives. As can be seen from the figure, although the detection rate behaves similarly in both methods, the false positives can be reduced significantly by properly adjusting the threshold on the resulting LASSO estimates.

What is specifically illustrated in FIG. 3 is the support set estimation using LASSO: for n=6000, $\sigma=0.1$, min $\|x_i\| \geq 3.34$, threshold $\xi_1=0.01$, 0.10, and 1.00. The circle markers depict detection rate, and square markers depict false positive rate.

Figure 4:
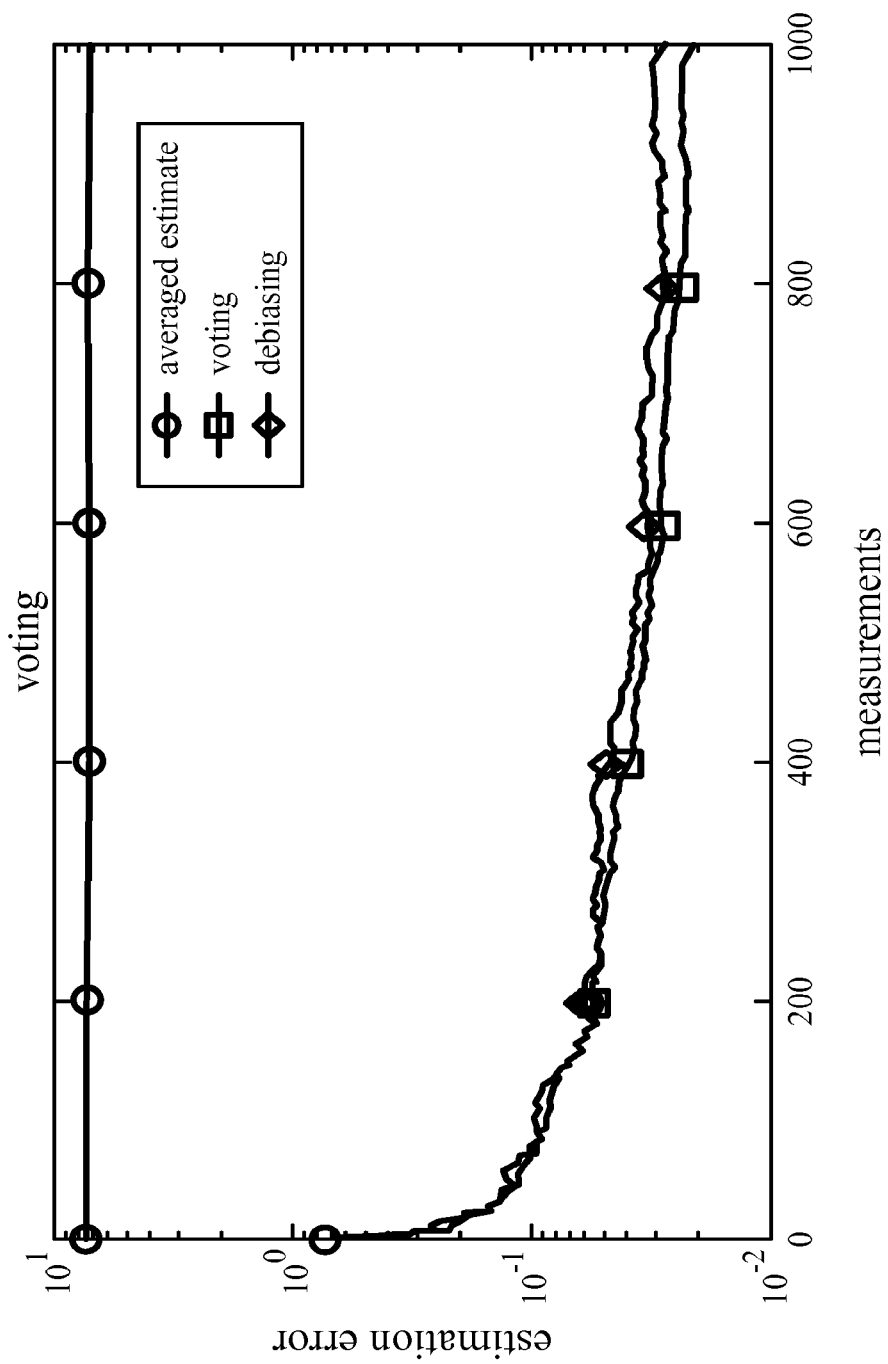
FIG. 4 represents error plots for a) averaged estimates, b) debiased and averaged estimates and c) estimates obtained by voting and averaging.

As discussed in detail in the above, the LASSO method can be used together with a voting strategy and least squares estimation to yield an unbiased estimator. FIG. 4 shows the comparison of performance of a) single LASSO estimates, b) averaged estimates, c) voting strategy, and d) debiasing and averaging.

The figure is obtained by using a fixed $x \in R^n$ and taking measurements with uncorrelated noise. It can be seen that the error does not decrease to zero for averaged estimate, which is due to LASSO being a biased estimator, as explained earlier in this document. Specifically FIG. 4 is a representation of error plots for a) averaged estimates, b) debiased and averaged estimates and c) estimates obtained by voting and averaging.

Figure 5:
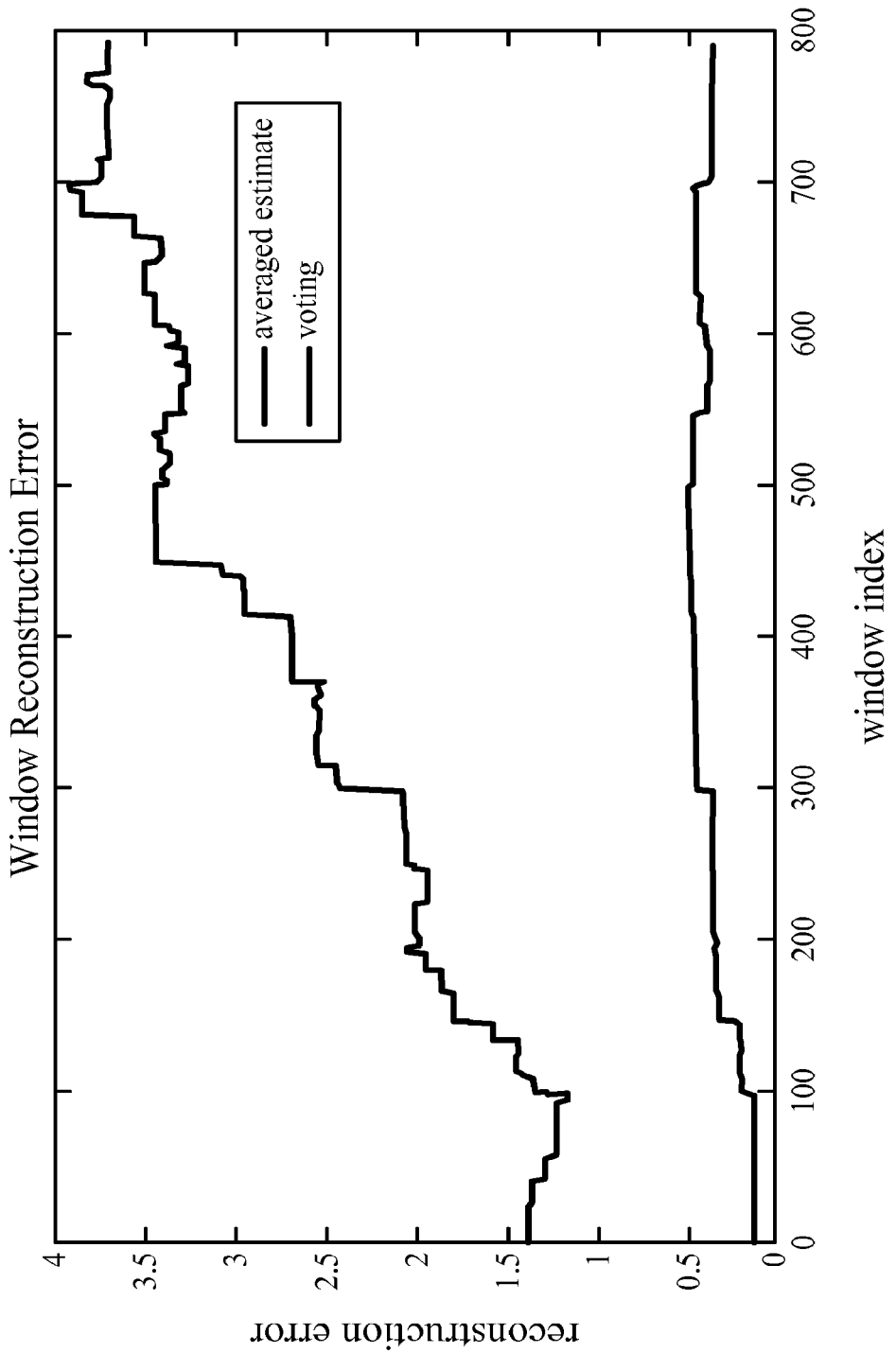
FIG. 5 represents error plots for averaged LASSO estimate and 'voting and averaging' on streaming data.

Referring now to FIG. 5, the figure illustrates error plots for averaged LASSO estimate and 'voting and averaging' on streaming data.

FIG. 5 shows a comparison between the window reconstruction error obtained with averaged LASSO estimates and 'voting and averaging' algorithm on streaming data. Data is generated randomly where an entry is selected as support with p=0.05 and its amplitude is drawn independently and identically distributed from uniform distribution $$U\ ([-1.3847, -2.3847] \cup [1.3847, 2.3847])$$

to satisfy the conditions of support detection theorem, wherein n=400, m=5 np=100 and the sampling matrix is Gaussian. The measurements are contaminated with $$w^{(i)} \sim N(0, \sigma^2 I_m)$$

where $\sigma=0.05$, and the voting algorithm uses $\xi_1=0.5$ and $\xi_2=20$. As can be seen voting gives a reconstruction error that shows jumps due to waiting for $\xi_2$ votes to be collected to use an entry in LSE. However, it also can be seen that after the position is accepted as part of the support, the error drops instantly to lower values than simply averaging the LASSO estimates.

Therefore, what is proposed in accordance with one embodiment is an efficient method for recursive sampling and iterative recovery pertinent to compressed sensing on streaming data. The method leverages signal overlaps between successive processing windows in obtaining a faster convergence speed for the estimates of the signal while achieving estimation variance reduction in the presence of noise.

Further, in accordance with another embodiment is proposed a two step estimation procedure to approximate an unbiased estimator of the signal based on LASSO where a) support detection is performed by solving LASSO, and b) signal estimation is obtained by solving ordinary least squares on the estimated support set. The computational complexity of the algorithm is O(mn) where m is the number of samples taken and n is the window length. The convergence time is shown by experiments to be appropriate for online implementation on streaming data.

Therefore to summarize, embodiments include a method for compressed sensing of streaming data that involves performing a recursive scheme for performing compressed sensing on streaming data, that is as well capable of analyzing the computational complexity and estimation error of the method. In accordance with one embodiment, the input stream of data is sampled recursively via overlapping windowing while making use of the previous measurement in obtaining the next one. Leveraging the overlapping window structure, the signal estimate from the previous window is utilized, in order to achieve faster convergence in an iterative optimization algorithm, to decode the new window. The estimation accuracy is enhanced by averaging signal estimates obtained from multiple windows. To remove the bias of the estimator, a two step estimation procedure is proposed in accordance with one embodiment comprising support set detection and signal amplitude estimation. Furthermore, one embodiment includes a voting scheme for robust support estimation in the presence of high measurement noise.

The simulation results obtained while employing the means according to one embodiment for compressed sensing of streaming data show a speed up of ten times with respect to applying traditional compressed sensing on a stream of data, while obtaining significantly lower reconstruction error under mild conditions on the signal magnitudes and the noise level.

In accordance with another embodiment, means for sensing streaming data are as well proposed. Said means for sensing streaming data comprise means for recursively sampling an input stream of data, and means for employing previous measurements for obtaining a subsequent measurement. The means for recursively sampling an input stream of data are capable of using the steps of overlapping windowing to obtain at least a previous measurement.

One embodiment includes ranging with ultra wideband signals. For example, a device may continuously monitor return pulses to regularly transmitted spikes (the signal emitted is periodic). Generally, the device receives a main echo, plus added multiple echoes. If the device is moving, the main echo just slightly changes from one period to another period, as do the multiple echoes. This is not a periodic signal, just an almost periodic signal, and a sliding window algorithm will naturally track these shifting echoes. In such embodiments, echo data from an acoustic sensor is thereby transformed into range data.

In another example, biomedical sample data may be transformed according to methods and systems described above. For example, samples from one or more electrical sensors configured to receive electrical signals from a human body may be processed according to embodiments disclose herein to reconstruct electrocardiographic or electroencephalographic signals. In some embodiments, the reconstructed signal may be matched to signatures characteristic of one or more diagnostic conditions.

In another example, sample data from a camera, photoelectric, or other pixel array sensor (for example, configured to receive visible light or infra-red light) may be processed as described herein. For example, using such techniques an apparatus may be able to improve power efficiency or increase effective sensitivity of the sensor.

In other embodiments, environmental sensor data such as temperature, wind speed, wind direction, precipitation may be processed as described herein.

The means of the present invention may be implemented as software means, hardware means or a combination thereof.

The systems and methods described above can be embodied, for example, in a wireless modem or wireless device integrating such a modem.

It is to be recognized that depending on the embodiment, certain acts or events of any of the methods described herein can be performed in a different sequence, may be added, merged, or left out all together (e.g., not all described acts or events are necessary for the practice of the method). Moreover, in certain embodiments, acts or events may be performed concurrently, e.g., through multi-threaded processing, interrupt processing, or multiple processors, rather than sequentially.

Those of skill will recognize that the various illustrative logical blocks, modules, circuits, and algorithm steps described in connection with the methods, systems, and apparatuses disclosed herein may be implemented as electronic hardware, computer software executed by a processor, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

Moreover, embodiments disclosed herein may be implemented or performed with an electronic device or circuit such as a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

Specifically in accordance with an embodiment of the present invention, an apparatus for performing compressed sensing of streaming data, comprises a recursive sampler arranged for recursively sampling an input stream of data using overlapping windowing to obtain at least one previous measurement regarding the input data stream, and a unit employing the at least one previous measurement for obtaining a subsequent measurement.

The apparatus proposed in accordance with one embodiment of the present invention comprises a recursive sampler that is based on a recursive scheme for performing sensing. The apparatus for performing compressed sensing of streaming data of the present invention also comprises a processing unit for processing she input stream of data sampled during the step of recursive sampling via recursive estimation.

In accordance with the present invention, the apparatus for performing compressed sensing of streaming data also comprises storing means for delivering the inputting information regarding the data stream of a previous estimate obtained during a previous estimate obtention step. Further, the apparatus for performing compressed sensing of streaming data of the present invention comprises a counter arranged for performing count estimation based on information obtained during a data stream support detection step. Further yet, the apparatus of the present invention may also comprise a calculator for calculating a least squares estimation (LSE) value for a data stream support set based on data obtained during said recursive estimation step. A processing unit for averaging the calculated least squares estimation value, the count estimation value, and the previous estimate to calculate an averaged value to obtain an averaged value is as well comprised by the apparatus proposed in accordance with one embodiment of the present invention. An estimator for estimating an error degree of the method for sensing streaming data is as well envisioned to be comprised by the apparatus proposed in accordance with the present invention. In addition, a processing unit for averaging signal estimates obtained from a plurality of windows may be as well comprised by the apparatus proposed by the present invention.

Various examples have been described. These and other examples are within the scope of the following claims.

What is claimed is:

1. A method of performing compressed sensing of streaming data, comprising:
    receiving an input data stream from an imaging sensor over a wireless network;
    recursively sampling, via a processor, the input data stream using successive overlapping windows, the recursively sampling comprising at least:
    obtaining at least one previous measurement corresponding to a first overlapping window in the input data stream,
    subsequently obtaining, using the at least one previous measurement, a current measurement corresponding to a second overlapping window that immediately follows the first overlapping window in the input data stream, the subsequently obtaining the current measurement comprising processing the input data stream sampled during the recursive sampling via recursive estimation, and
    varying an amount of an overlap between the first and second overlapping windows;
    analyzing an error of a quantity of the previous and current measurements, wherein the error substantially approaches zero as the quantity of the previous and current measurements obtained increases;
    calculating a least squares estimation (LSE) value for a data stream support set based on data obtained during the recursive estimation;
    averaging the calculated least squares estimation value, a count estimation value, and the previous estimate to calculate an averaged value;
    employing the averaged value to obtain a new estimate for the streaming data;
    reconstructing image data based on the recursively sampled input data stream; and
    transmitting the reconstructed image data for display.

2. The method for performing compressed sensing of streaming data of claim 1, wherein the method for sensing streaming data employs a recursive scheme for performing the sampling.

3. The method for performing compressed sensing of streaming data of claim 1, further comprising:
    receiving information regarding the input data stream, wherein the information concerns a previous estimate obtained during a previous estimate obtention step, the previous estimate obtention step being performed prior to the recursive sampling step.

4. The method for performing compressed sensing of streaming data of claim 1, further comprising:
    detecting the data stream support, and
    performing count estimation based on information obtained during the data stream support detection.

5. The method for performing compressed sensing of streaming data of claim 1, further comprising analyzing a computational complexity of the compressed sensing of streaming data.

6. The method for performing compressed sensing of streaming data of claim 1, further comprising obtaining convergence in an iterative optimization algorithm to decode a new window.

7. The method for performing compressed sensing of streaming data of claim 6, wherein the obtaining convergence comprises leveraging an overlapping window structure employed by using successive overlapping windows and a signal estimate regarding a previous overlapping window.

8. The method for performing compressed sensing of streaming data of claim 1, further comprising averaging signal estimates obtained from the successive overlapping windows.

9. The method for performing compressed sensing of streaming data of claim 8, further comprising:
    performing support set detection, and
    signal amplitude estimation.

10. The method for performing compressed sensing of streaming data of claim 1, further comprising applying a voting scheme for robust support estimation in the presence of a high measurement noise.

11. A system for performing compressed sensing of streaming data, including a plurality of modules, each module comprising a computer readable medium having thereon computer executable instructions for:
    receiving an input data stream from an imaging sensor over a wireless network;
    recursively sampling, via a processor, the input data stream using successive overlapping windows, the recursively sampling comprising at least:
    obtaining at least one previous measurement corresponding to a first overlapping window in the input data stream,
    subsequently obtaining, using the at least one previous measurement, a current measurement corresponding to a second overlapping window that immediately follows the first overlapping window in the input data stream, the subsequently obtaining the current measurement comprising processing the input data stream sampled during the recursive sampling via recursive estimation, and
    varying an amount of an overlap between the first and second overlapping windows;

analyzing an estimation error of a quantity of the previous and current measurements, wherein the estimation error substantially approaches zero as the quantity of the previous and current measurements obtained increases;

calculating a least squares estimation (LSE) value for a data stream support set based on data obtained during the recursive estimation;

averaging the calculated least squares estimation value, a count estimation value, and the previous estimate to calculate an averaged value;

employing the averaged value to obtain a new estimate for the streaming data;

reconstructing image data based on the recursively sampled input stream of data; and transmitting the reconstructed image data for display.

12. A non-transitory computer readable storage medium having recorded thereon a computer program for sensing streaming data, the computer program comprising an algorithm capable of:

receiving an input stream of data from an imaging sensor over a wireless network;

recursively sampling, via a processor, the input stream of data using successive overlapping windows, the recursively sampling comprising at least:

obtaining at least one previous measurement corresponding to a first overlapping window in the input data stream, subsequently obtaining, using said at least one previous measurement, a current measurement corresponding to a second overlapping window that immediately follows the first overlapping window in the input data stream, the subsequently obtaining the current measurement comprising processing the input data stream sampled during the recursive sampling via recursive estimation, and varying an amount of an overlap between the first and second overlapping windows;

analyzing an estimation error of a quantity of the previous and current measurements, wherein the estimation error substantially approaches zero as the quantity of the previous and current measurements obtained increases;

calculating a least squares estimation (LSE) value for a data stream support set based on data obtained during the recursive estimation;

averaging the calculated least squares estimation value, a count estimation value, and the previous estimate to calculate an averaged value;

employing the averaged value to obtain a new estimate for the streaming data;

reconstructing image data based on the recursively sampled input stream of data; and transmitting the reconstructed image data for display.

13. An apparatus for performing compressed sensing of streaming data, comprising:

a communication circuit configured to receive an input stream of sensor data from an imaging sensor over a wireless network;

a memory configured to store the input stream of sensor data; and a processor configured to:

recursively sample the input stream of sensor data using successive overlapping windows at least in part by:

obtaining at least one previous measurement corresponding to a first overlapping window in the input stream of sensor data;

subsequently obtaining, using the at least one previous measurement, a current measurement corresponding to a second overlapping window that immediately follows the first overlapping window in the input stream of sensor data, the subsequently obtaining the current measurement comprising processing the input data stream sampled during the recursive sampling via recursive estimation; and vary an amount of an overlap between the first and second overlapping windows;

analyze an estimation error of a quantity of the previous and current measurements, wherein the estimation error substantially approaches zero as the quantity of the previous and current measurements obtained increases;

calculate a least squares estimation (LSE) value for a data stream support set based on data obtained during the recursive estimation;

average the calculated least squares estimation value, a count estimation value, and a previous estimate obtained during a previous estimate obtention step to calculate an averaged value to obtain an averaged value;

employing the averaged value to obtain a new estimate for the streaming data; and reconstruct image data based on the recursively sampled input stream of sensor data, wherein the communication circuit is further configured to transmit the reconstructed data for display.

14. The apparatus for performing compressed sensing of streaming data of claim 13, wherein the processor is configured to recursively sample based on a recursive scheme for performing the sensing.

15. The apparatus for performing compressed sensing of streaming data of claim 13, further comprising a store for delivering inputting information regarding the input stream of sensor data regarding a previous estimate obtained during a previous estimate obtention.

16. The apparatus for performing compressed sensing of streaming data of claim 13, wherein the processor is further configured to perform count estimation based on information obtained during a data stream support detection step.

17. The apparatus for performing compressed sensing of streaming data of claim 13, wherein the processor is further configured to average signal estimates obtained from the successive overlapping windows.

18. The apparatus for performing compressed sensing of streaming data of claim 13, further comprising one or more sensors configured to measure the input stream of sensor data.

* * * * *